(12) United States Patent
Park

(10) Patent No.: US 9,671,431 B2
(45) Date of Patent: Jun. 6, 2017

(54) PROBE CARD AND MANUFACTURING METHOD

(75) Inventor: Young Geun Park, Suwon-si (KR)

(73) Assignee: M2N INC., Yongin-si, Gyeonggi-Do (KR)

( * ) Notice: Subject to any disclaimer, the term of this patent is extended or adjusted under 35 U.S.C. 154(b) by 400 days.

(21) Appl. No.: 14/003,310

(22) PCT Filed: Apr. 28, 2011

(86) PCT No.: PCT/KR2011/003146
§ 371 (c)(1),
(2), (4) Date: Sep. 5, 2013

(87) PCT Pub. No.: WO2012/121449
PCT Pub. Date: Sep. 13, 2012

(65) Prior Publication Data
US 2013/0342232 A1  Dec. 26, 2013

(30) Foreign Application Priority Data

Mar. 8, 2011  (KR) .................. 10-2011-0020444

(51) Int. Cl.
*G01R 1/073* (2006.01)
*G01R 3/00* (2006.01)

(52) U.S. Cl.
CPC ..... *G01R 1/07378* (2013.01); *G01R 1/07342* (2013.01); *G01R 3/00* (2013.01); *Y10T 29/49124* (2015.01); *Y10T 29/49128* (2015.01)

(58) Field of Classification Search
CPC ............ G01R 1/07378; G01R 1/07342; Y10T 29/49124; Y10T 29/49128

(Continued)

(56) References Cited

U.S. PATENT DOCUMENTS 6,504,223 B1 * 1/2003 Zhou .................. G01R 1/06733
257/48
6,736,665 B2 * 5/2004 Zhou .................. G01R 1/06711
257/E23.021

(Continued)

FOREIGN PATENT DOCUMENTS

KR  10-2009-0079273 A  7/2009
KR  10-2009-0085726 A  8/2009
KR  10-2011-0016300 A  2/2011

OTHER PUBLICATIONS

International Search Report for PCT/KR2011/003146 dated Apr. 4, 2012.

*Primary Examiner* — Melissa Koval
*Assistant Examiner* — Courtney McDonnough
(74) *Attorney, Agent, or Firm* — Pearne & Gordon LLP

(57) ABSTRACT

There is provided a probe card in contact with pads formed on a plurality of semiconductor dies on a wafer to test the semiconductor dies. The probe card includes a printed circuit board on which a plurality of pads are formed; a block plate having a plurality of grooves and attached to the printed circuit board; a plurality of sub-probe units equipped with a plurality of probe tips in contact with the pads of the semiconductor dies and detachably coupled to the plurality of grooves; and a plurality of interposer/space transformer units interposed between the sub-probe units and the printed circuit board and configured to electrically connect the probe tips to the pads of the printed circuit board and transform a pitch of the pads formed on the printed circuit to a pitch of the plurality of probe tips.

12 Claims, 10 Drawing Sheets

(58) Field of Classification Search
USPC .................................................. 324/750.16
See application file for complete search history.

(56) References Cited

U.S. PATENT DOCUMENTS

| | | | |
|---|---|---|---|
| 2002/0131682 A1* | 9/2002 | Nasiri | G02B 26/0841 385/18 |
| 2004/0124519 A1* | 7/2004 | Zhou | G01R 1/07378 257/686 |
| 2005/0083072 A1* | 4/2005 | Mori | G01R 1/06733 324/756.03 |
| 2009/0212795 A1* | 8/2009 | Williams | G01R 1/07314 324/754.07 |
| 2010/0134126 A1* | 6/2010 | Hong | G01R 3/00 324/754.03 |
| 2010/0134129 A1* | 6/2010 | Breinlinger | G01R 31/2889 324/756.03 |

* cited by examiner

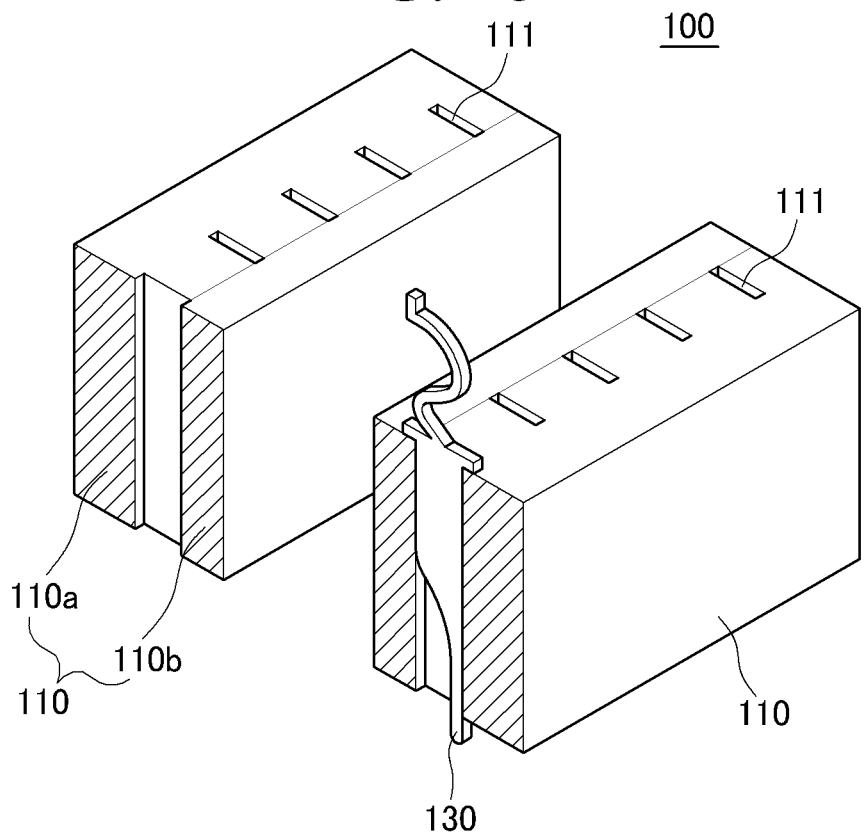

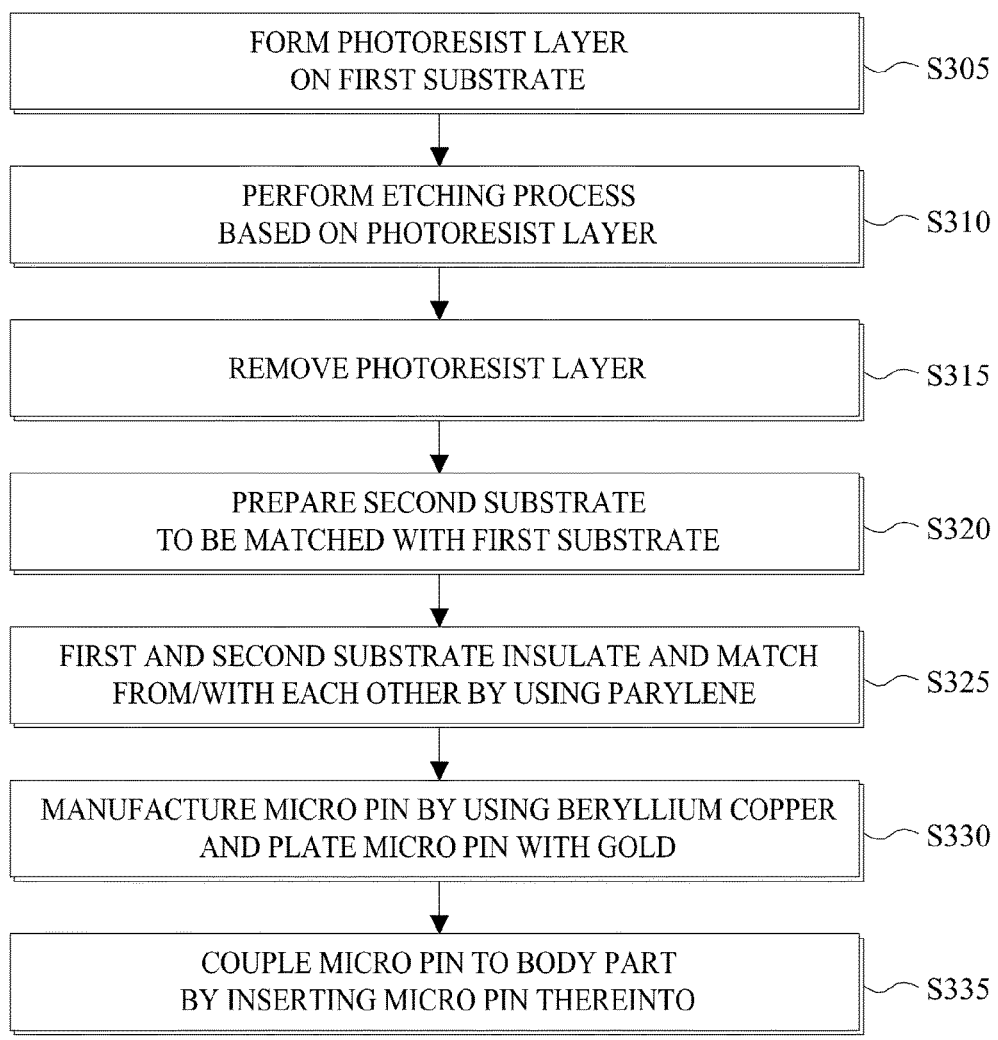

PROBE CARD AND MANUFACTURING METHOD

TECHNICAL FIELD

The present disclosure relates to a probe card and a manufacturing method thereof, and more particularly, to a probe card comprising an interposer/space transformer unit that electrically connects a printed circuit board with sub-probe units and transforms a pitch of pads formed on the printed circuit board to a pitch of probe tips of the sub-probe units and a manufacturing method thereof.

BACKGROUND ART

Generally, a probe card is a device configured to transmit an electric signal of a semiconductor device tester to a chip as a target object to be tested on a wafer and transmit a signal from the chip to the semiconductor device tester by electrically connecting the wafer to the semiconductor device tester in order to test performance of a semiconductor device such as a semiconductor memory, a display, or the like during or after a manufacturing process.

A typical probe card is composed of a printed circuit board (PCB), a space transformer (STF), tips fixed on the space transformer, and an interposer configured to connect the printed circuit board to the space transformer. The space transformer is formed of a multilayer ceramic (MLC) substrate.

That is, in the space transformer, ceramic layers and metallic layers are layered alternately, an interval between the adjacent metallic layers becomes narrow from an upper substrate connected to the printed circuit board toward a lower side connected to the tips, and a pitch can be transformed.

However, such a space transformer is manufactured from a multilayer ceramic substrate, which requires a long manufacturing period and high manufacturing costs.

In particular, a space transformer is an expensive product, and its cost accounts for a considerable part of manufacturing costs of a probe card. As a probe card becomes large-scaled, a space transformer also becomes large-scaled, resulting in an increase in manufacturing costs of the probe card.

DISCLOSURE OF THE INVENTION

Problems to Be Solved by the Invention

The present disclosure is provided to solve the above-mentioned problems of a conventional technology. An objective of the present disclosure is to provide a probe card and a manufacturing method thereof capable of reducing costs by eliminating a space transformer by electrically connecting modular sub-probe units with a printed circuit board and probe tips and simultaneously transforming a pitch of pads formed on the printed circuit board to a pitch of probe tips of the sub-probe units.

Means for Solving the Problems

In accordance with a first aspect of the present disclosure, there is provided a probe card in contact with pads formed on a plurality of semiconductor dies on a wafer to test the semiconductor dies, including a printed circuit board on which a plurality of pads are formed; a block plate having a plurality of grooves and attached to the printed circuit board; a plurality of sub-probe units equipped with a plurality of probe tips in contact with the pads of the semiconductor dies and detachably coupled to the plurality of grooves; and a plurality of interposer/space transformer units interposed between the sub-probe units and the printed circuit board and configured to electrically connect the probe tips to the pads of the printed circuit board and transform a pitch of the pads formed on the printed circuit to a pitch of the plurality of probe tips.

In accordance with a first aspect of the present disclosure, the interposer/space transformer unit includes a body part having a plurality of slits that define a space transformation path; and a plurality of micro pins that are inserted into the plurality of slits to electrically connect the printed circuit board to the sub-probe units.

In accordance with a first aspect of the present disclosure, one of the interposer/space transformer units and the sub-probe unit corresponding thereto are detachably coupled to one of the grooves.

In accordance with a first aspect of the present disclosure, the body part is formed by bonding a plurality of silicon substrates in a direction perpendicular to a Z-axis direction.

In accordance with a first aspect of the present disclosure, the plurality of slits that define a space transformation path are formed in a surface of one of the silicon substrates by a photolithography process.

In accordance with a first aspect of the present disclosure, a distance between the plurality of slits at the printed circuit board's side is greater than a distance between the plurality of slits at the sub-probe unit's side.

In accordance with a first aspect of the present disclosure, one of the plurality of micro pins includes a first contact portion in contact with the probe tip; a second contact portion in contact with the printed circuit board; and a pin body portion provided within the slit along the space transformation path.

In accordance with a first aspect of the present disclosure, the first contact portion and the second contact portion are protruded toward an outside of the body part of the interposer/space transformer unit.

In accordance with a first aspect of the present disclosure, the second contact portion includes a stopper configured to determine a position of the micro pin by preventing the second contact portion from being inserted into the slit.

In accordance with a first aspect of the present disclosure, the second contact portion includes one or more bending portions at its termination end.

In accordance with a first aspect of the present disclosure, the plurality of micro pins are formed of at least one material of copper, a copper alloy, nickel, and a nickel alloy or formed by coating the at least one material with gold.

In accordance with a first aspect of the present disclosure, the sub-probe unit further includes a probe substrate into which the probe tips are inserted, and the probe substrate has a through hole through which a tip portion of the probe tip is protruded from one side and a connection portion of the probe tip is protruded from the other side, and the sub-probe unit is coupled to the interposer/space transformer unit by means of a ZIF-type coupling between the micro probe pin inserted into the slit and the probe tip inserted into the through hole.

In accordance with a first aspect of the present disclosure, at least a part of the tip portion of the probe tip and at least a part of the first contact portion of the micro pin are cross-inserted into the slit and the through hole, respectively, to be connected to each other.

In accordance with a first aspect of the present disclosure, one of the tip portion and the first contact portion is formed in a hook shape generating a spring friction force and becomes in contact with the other one to be coupled to each other by the spring friction force.

In accordance with a second aspect of the present disclosure, there is provided a manufacturing method of an interposer/space transformer unit used in a probe card, including: a) forming a photoresist layer on a first substrate; b) forming a plurality of slits that define a space transformation path by performing an etching process to the first substrate based on the photoresist layer; c) removing the photoresist layer after the step b); d) preparing a second substrate to be matched with an etched surface of the first substrate; e) insulating and matching the etched surface of the first substrate from/with one surface of the second substrate; f) manufacturing micro pins; and g) coupling the micro pins to the plurality of slits by partially inserting the micro pins into the plurality of slits.

In accordance with a second aspect of the present disclosure, in the step b), the etching process to the first substrate is carried out by a deep reactive ion etching (DRIE) method.

In accordance with a second aspect of the present disclosure, in the step c), the photoresist layer is removed by an asking method.

In accordance with a second aspect of the present disclosure, in the step e), the first substrate and the second substrate are insulated from and matched with each other by using parylene.

In accordance with a second aspect of the present disclosure, the micro pins are formed of at least one of copper, a copper alloy, nickel, and a nickel alloy or formed by coating at least one of the materials with gold.

In accordance with a third aspect of the present disclosure, there is provided a manufacturing method of a probe card in contact with pads formed on a plurality of semiconductor dies on a wafer to test the semiconductor dies, including: a) preparing a printed circuit board; b) manufacturing and preparing a plurality of sub-probe units each including a plurality of probe tips in contact with the pads formed on the plurality of semiconductor dies; c) manufacturing and preparing an interposer/space transformer unit that electrically connects the printed circuit board to the sub-probe units; d) manufacturing and preparing a block plate having a plurality of grooves to which the sub-probe units and the interposer/space transformer unit are detachably coupled; e) connecting the interposer/space transformer unit to the sub-probe units; f) mounting the sub-probe units connected to the interposer/space transformer unit in the grooves of the block plate; and g) coupling the block plate on which the sub-probe units are mounted to the printed circuit board.

In accordance with a third aspect of the present disclosure, in the step e), one side of a micro pin of the interposer/space transformer unit and the probe tip of the sub-probe unit are coupled to each other by means of a ZIF (Zero Insertion Force)-type coupling.

In accordance with a third aspect of the present disclosure, one of a first contact portion formed at the micro pin and a tip portion of the probe tip is formed in a hook shape generating a spring friction force and becomes in contact with the other one to be coupled to each other by the spring friction force.

Effect of the Invention

The present disclosure provides a probe card and a manufacturing method thereof capable of reducing costs by eliminating a space transformer by electrically connecting modular sub-probe units with a printed circuit board and probe tips and simultaneously transforming a pitch of pads formed on the printed circuit board to a pitch of probe tips of the sub-probe units.

BRIEF DESCRIPTION OF THE DRAWINGS

FIGS. 2A and 2B are perspective views each showing a partial cross section of an interposer/space transformer unit of FIG. 1;

FIG. 4 is a flow chart showing a manufacturing process of the interposer/space transformer unit of FIG. 1;

BEST MODE FOR CARRYING OUT THE INVENTION

Figure 1:
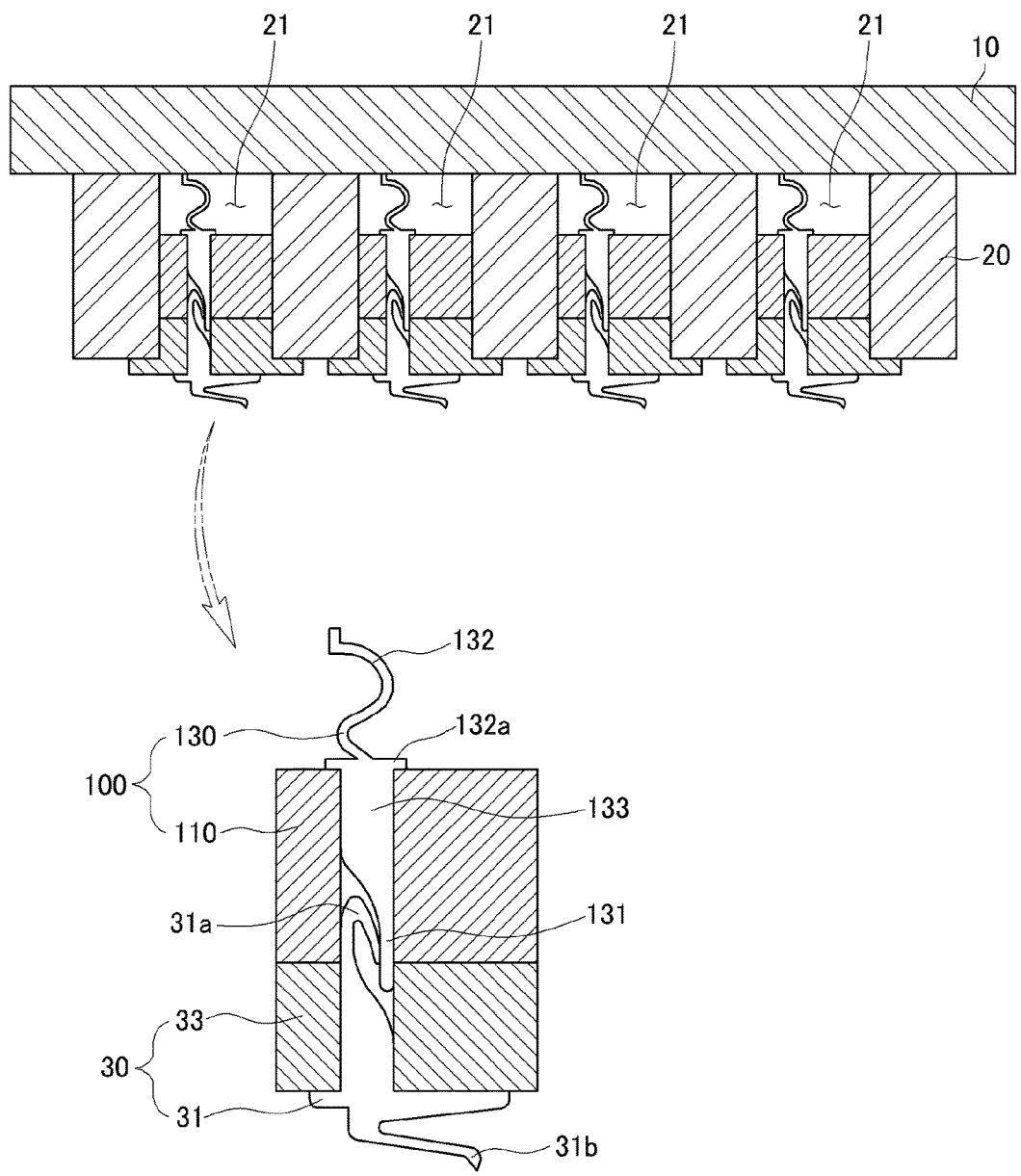
FIG. 1 is a cross-sectional view showing a cross section of a probe card in accordance with the present disclosure.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, the term "comprises or includes" and/or "comprising or including" used in the document means that one or more other components, steps, operation and/or existence or addition of elements are not excluded in addition to the described components, steps, operation and/or elements unless context dictates otherwise.

Figure 2A:
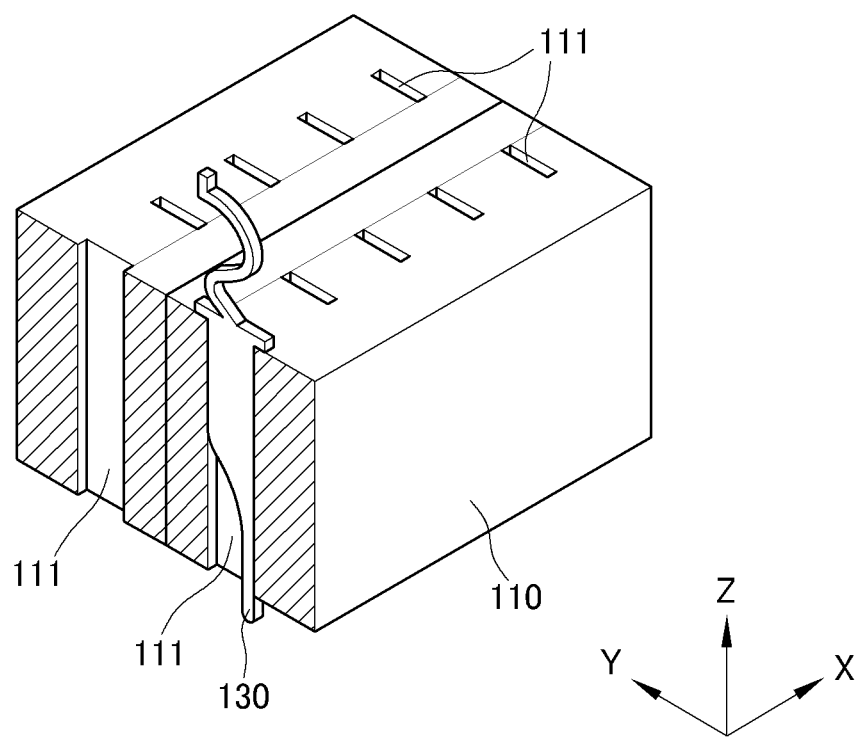
Figure 3:
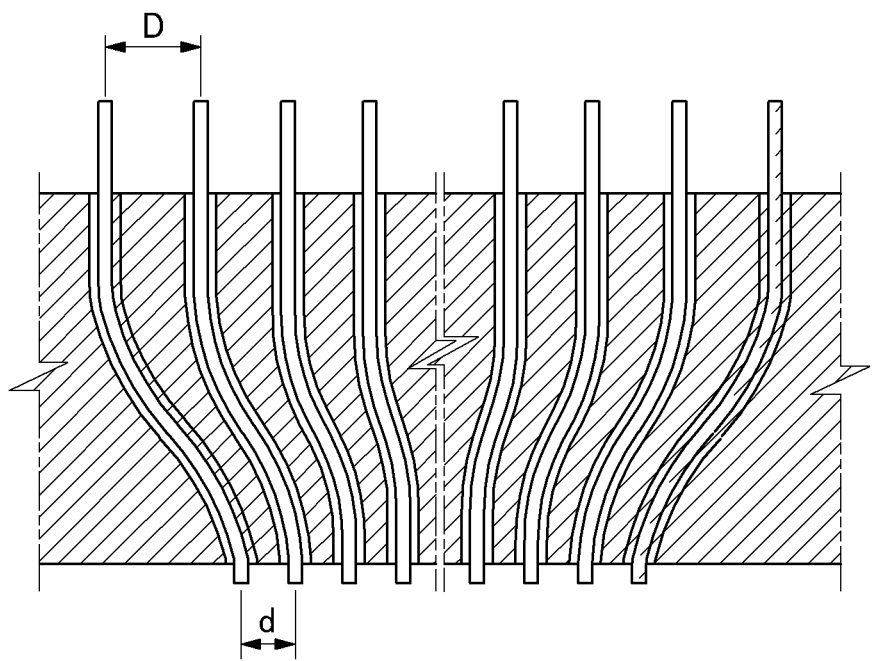
FIG. 3 is s front cross-sectional view of the interposer/space transformer unit of FIG. 1.
Figure 5A:
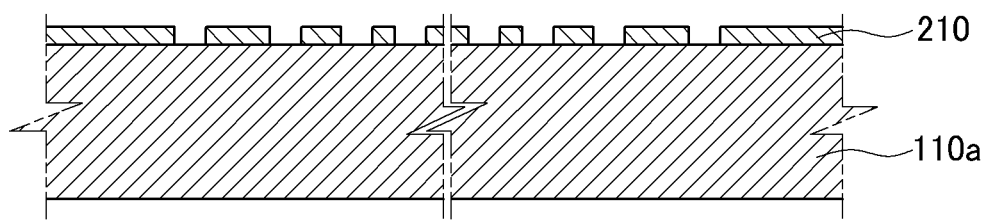
FIGS. 5A to 5D are cross-sectional views showing a manufacturing process of a body part of the interposer/space transformer unit of FIG. 4.
Figure 5B:
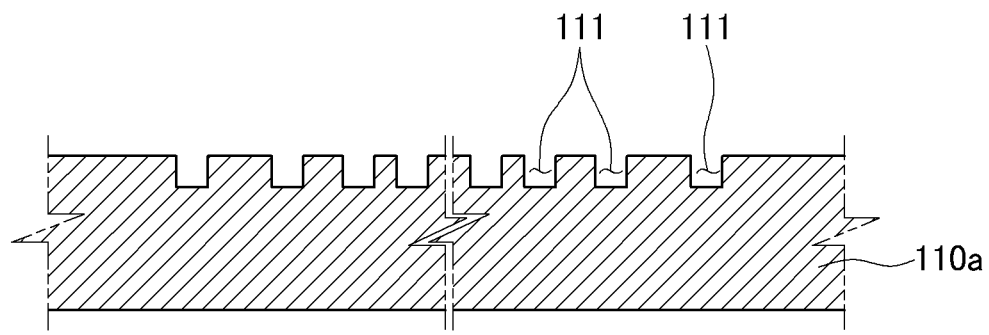
Figure 5C:
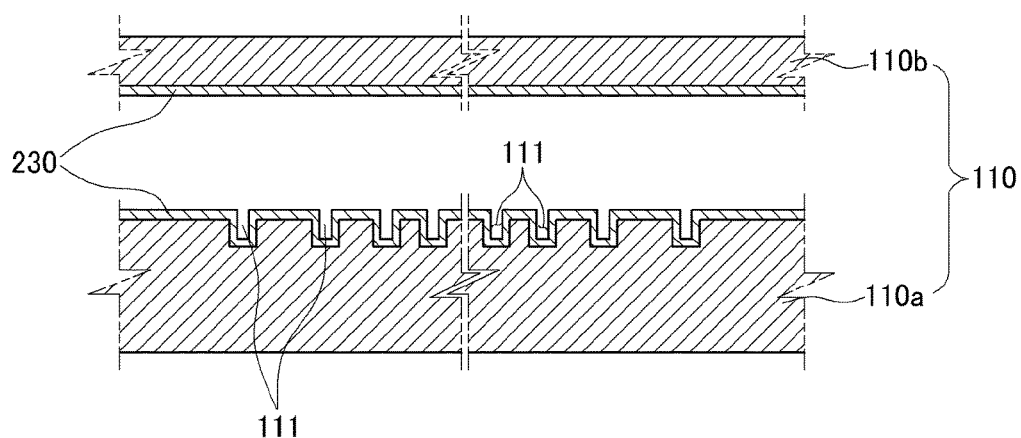
Figure 5D:
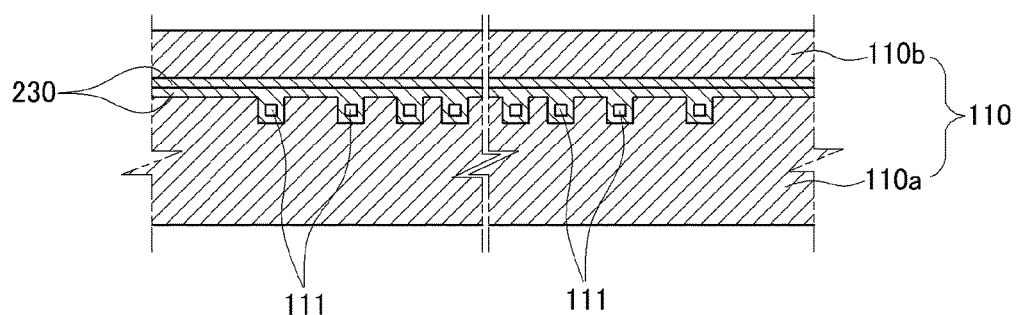
Figure 6:
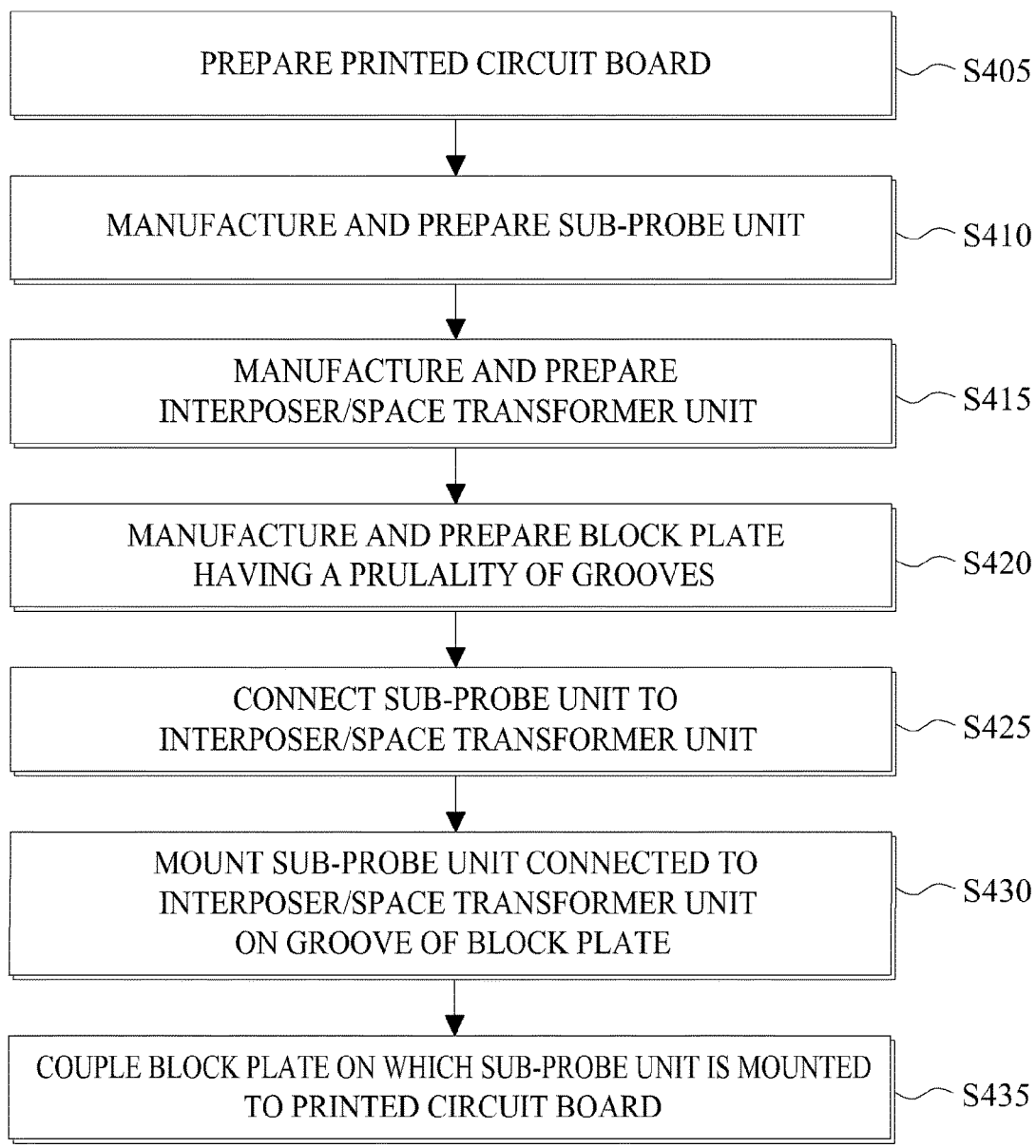
FIG. 6 is a flow chart showing a manufacturing process of the probe card of FIG. 1.
Figure 7A:
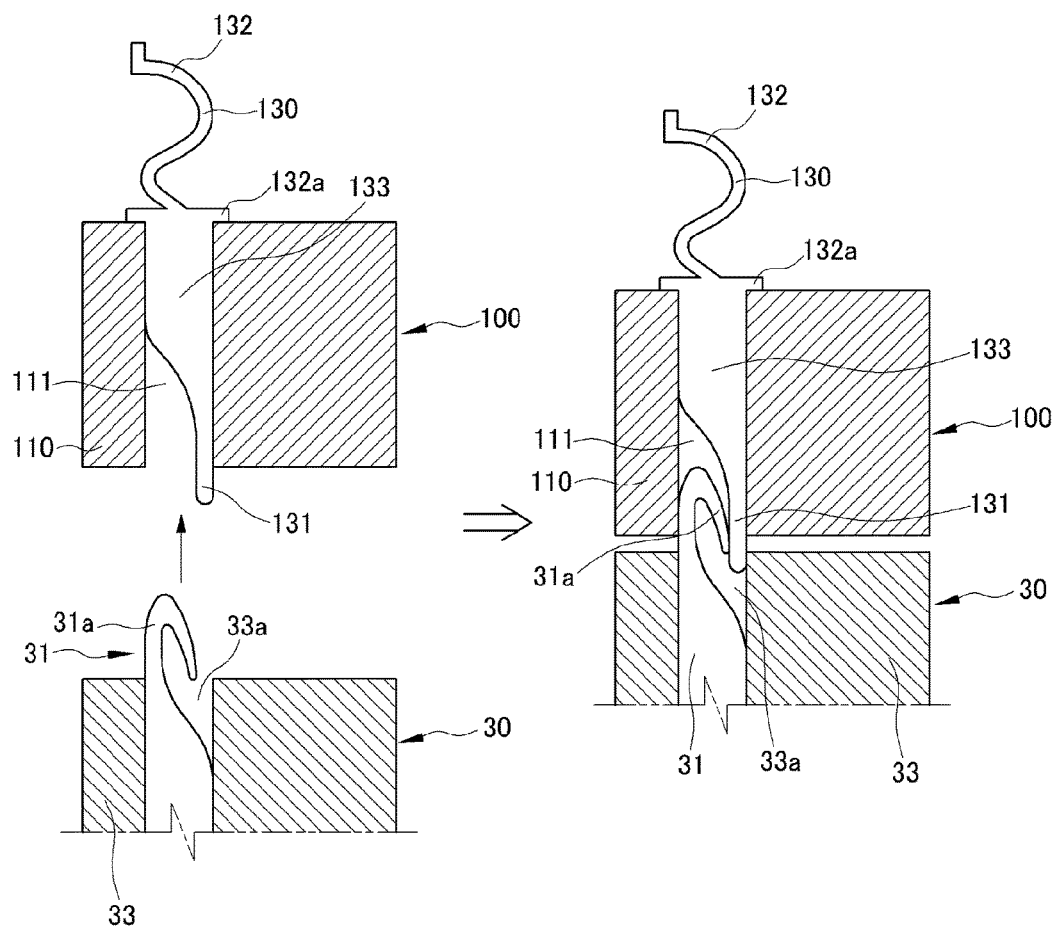
FIGS. 7A and 7B are cross-sectional views showing an illustrative embodiment of a coupling process of the interposer/space transformer unit and a sub-probe unit of FIG. 1.
Figure 7B:
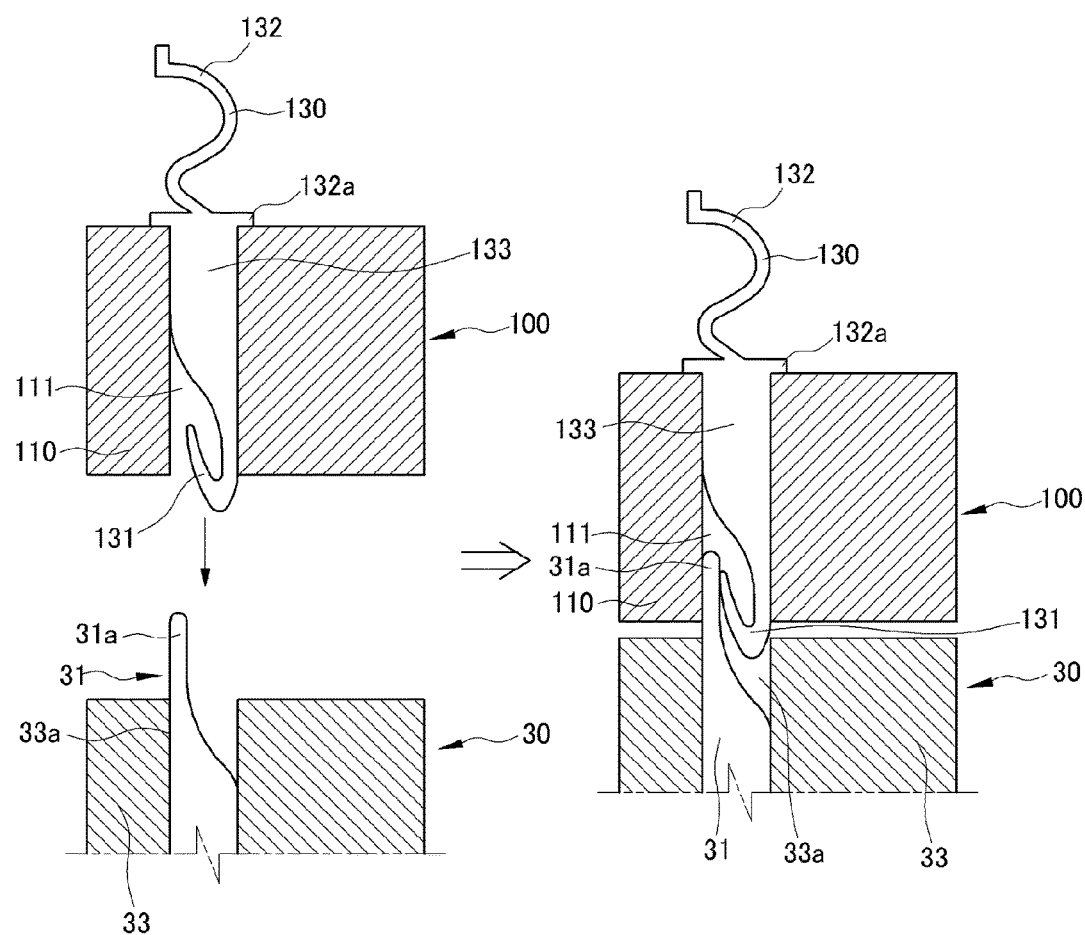

FIG. 1 is a cross-sectional view showing a cross section of a probe card in accordance with the present disclosure, FIGS. 2A and 2B are perspective views each showing a partial cross section of an interposer/space transformer unit of FIG. 1, FIG. 3 is s front cross-sectional view of the interposer/space transformer unit of FIG. 1, FIG. 4 is a flow chart showing a manufacturing process of the interposer/space transformer unit of FIG. 1, FIGS. 5A to 5D are cross-sectional views showing a manufacturing process of a body part of the interposer/space transformer unit of FIG. 4, FIG. 6 is a flow chart showing a manufacturing process of the probe card of FIG. 1, and FIGS. 7A and 7B are cross-sectional views showing an illustrative embodiment of a combining process of the interposer/space transformer unit and a sub-probe unit of FIG. 1.

Referring to FIG. 1, a probe card in accordance with the present disclosure includes a printed circuit board 10, a block plate 20 having a plurality of grooves 21 and attached to the printed circuit board 10, a plurality of sub-probe units 30 equipped with a plurality of probe tips 31 in contact with pads of semiconductor dies and detachably coupled to the grooves 21, and a plurality of interposer/space transformer units 100 interposed between the sub-probe units 30 and the printed circuit board 10 and configured to electrically connect the probe tips 31 to pads (not illustrated) of the printed circuit board 10 and transform a pitch of the pads formed on the printed circuit 10 to a pitch of the plurality of probe tips 10.

Generally, the block plate 20 attached to the printed circuit board 10 is manufactured in the same form as the printed circuit board 10 and includes the same or less number of grooves 21 as the number of the semiconductor dies at positions corresponding to those of the semiconductor dies.

The plurality of sub-probe units 30 are detachably coupled to the plurality of grooves 21 formed on the block plate 20. One of the plurality of sub-probe units 30 includes the plurality of probe tips 30 in contact with a pad formed on one of the plurality of semiconductor dies and a probe substrate 33 equipped with the plurality of probe tips 31.

Herein, the probe substrate 33 is configured to be coupled to the plurality of probe tips 31 and correct and fix the plurality of tips 31 to be aligned with each other and includes a plurality of through holes 33a into which the plurality of probe tips 31 are inserted.

The probe tip 31 includes a tip portion 31a at its one side and a connection portion 31b at the other side. The tip portion 31a protrudes from the one side and the connection portion 31b protrudes from the other side.

The interposer/space transformer unit 100 and the sub-probe unit 30 corresponding thereto are detachably coupled to the groove 21 formed at the block plate 20 with a size appropriate for being coupled thereto.

The interposer/space transformer unit 100 includes a body part 110 having a plurality of slits 111 that define a space transformation path and a plurality of micro pins 130 that are inserted into the plurality of slits 111 to electrically connect the printed circuit board 10 to the sub-probe units 30.

In the present illustrative embodiment, the body part 110 has a hexahedral block structure as depicted in FIG. 1 formed by bonding a plurality of substrates in a direction perpendicular to a Z-axis direction, and the substrates are made of silicon.

Further, as described above, the body part 110 has the plurality of slits 111 such that the micro pins 130 are inserted into the body part 110.

Meanwhile, in the body part 110, an insulating film 230 is formed on the slits 111 so as to prevent transmission of electricity to the body part 110 when the printed circuit board 10 and the sub-probe units 30 are electrically connected by the micro pins 130.

The slit 111 is formed such a way that a starting position on the printed circuit board 10's side is formed to be different from an ending position on the sub-probe unit 30's side so as to transform a pitch of pads formed on the printed circuit board 10 to a pitch of the plurality of probe tips 31.

Therefore, a distance between the plurality of slits 111 at the printed circuit board 10's side is greater than a distance between the plurality of slits 111 at the sub-probe unit 30's side as depicted in FIG. 3.

The micro pin 130 inserted into the slit 111 of the body part 110 will be explained in detail. The micro pin 130 includes a first contact portion 131 in contact with the probe tip 31, a second contact portion 132 in contact with the printed circuit board 10, and a pin body portion 133 provided within the slit 111 along the space transformation path.

Herein, the first contact portion 131 and the second contact portion 132 are protruded toward an outside of the body part 110. The second contact portion 132 includes a stopper 132a configured to determine a position of the micro pin 130 by preventing the second contact portion 132 from being inserted into the slit 111 of the body part 110 and further includes one or more bending portions at its termination end.

Meanwhile, the micro pin 130 is formed of at least one material of copper, a copper alloy, nickel, and a nickel alloy, or a surface of the micro pin 130 formed of the at least one material is coated with gold (Au).

Since copper, a copper alloy, nickel, and a nickel alloy has a sufficient elasticity to be inserted into a bent slit 111 as depicted in FIG. 3. If a surface of the micro pin 130 made of at least one of the materials is coated with gold, a contact resistance can be reduced and the printed circuit board 10 and the sub-probe units 30 can be electrically connected to each other.

Meanwhile, the first contact portion 131 of the micro pin 130 may have a bar shape as depicted in FIGS. 2 and 3 or a hook shape as depicted in FIG. 7A.

Hereinafter, there will be explained a manufacturing method of the interposer/space transformer unit 100 configured as described above with reference to FIGS. 4 and 5A to 5D.

The interposer/space transformer unit 100 of the present illustrative embodiment is manufactured based on a semiconductor manufacturing process. Firstly, a first substrate 110a made of silicon is prepared and a photoresist layer 210 is formed on the first substrate 110a (step S305).

Herein, the photoresist layer 210 is formed to have the plurality of slits 111 that define a space transformation path such a way that a starting position on the printed circuit board 10's side is formed to be different from an ending position on the sub-probe unit 30's side, and a distance between the plurality of slits 111 at the printed circuit board 10's side is greater than a distance between the plurality of slits 111 at the sub-probe unit 30's side as depicted in FIG. 3.

Then, the first substrate 110a is etched based on the photoresist layer 210 formed on the first substrate 110a (step S310). At this time, the plurality of slits 111 that define a space transformation path are formed at the first substrate 110a by the etching process.

Further, the etching process to the first substrate 110a in step S310 is carried out by a deep reactive ion etching (DRIE) method as an anisotropic etching method in which etching is carried out only in a direction perpendicular to a surface of the first substrate 110a.

After the first substrate 110a is etched, the photoresist layer 210 formed on the first substrate 110a is removed (step S315). At this time, the photoresist layer 210 can be removed by using an asking method.

Then, a second substrate 110b to be matched with an etched surface of the first substrate 110a is prepared (step S320).

When the second substrate 110b is prepared, the first substrate 110a and the second substrate 110b are matched with each other. At this time, the first substrate 110a and the second substrate 110b are matched with each other by using parylene.

Meanwhile, before the first substrate 110a and the second substrate 110b are matched with each other, when the printed circuit board 10 and the sub-probe units 30 are electrically connected by the micro pins 130, there is formed the insulating film 230 that prevents electrical conduction to the first substrate 110a and the second substrate 110b.

Herein, the insulating film 230 is not formed of a different material but formed of parylene used for matching the first substrate 110a and the second substrate 110b at the same time when the first substrate 110a and the second substrate 110b are matched with each other (step S325).

In the present illustrative embodiment, the insulating film 230 is formed of parylene on the first substrate 110a and the second substrate 110b at the same time when the first substrate 110a and the second substrate 110b are matched with each other. Otherwise, after the insulating film is separately formed of an insulating material such as $SiO_2$ and SiNx, the first substrate 110a and the second substrate 110b may be matched with each other.

After this process is ended, the body part 110 of the interposer/space transformer unit 100 having the plurality of slits 111 that define a space transformation path is completed.

Then, the micro pin 130 inserted into the slit 111 of the body part 110 is manufactured. In the micro pin 130, the pin body portion 133, the first contact portion 131, and the second contact portion 132 are formed by using at least one material of copper, a copper alloy, nickel, and a nickel alloy, and then a surface of the micro pin 130 made of the at least one materials is coated with gold (Au) (step S330).

After the micro pin 130 is manufactured, when the pin body portion 133 is allowed to be inserted into the slit 111, the interposer/space transformer unit 100 is completed (step S335).

FIG. 6 is a flow chart showing a manufacturing process of the probe card in accordance with the present illustrative embodiment, and FIGS. 7A and 7B schematically show of a coupling relationship between an interposer/space transformer unit and a sub-probe unit.

Hereinafter, a manufacturing method of the probe card in accordance with the present illustrative embodiment will be explained in detail with reference to FIGS. 6, 7A, and 7B.

The printed circuit board 10 is prepared (step S405), and when the printed circuit board 10 is prepared, the plurality of sub-probe units 30 are manufactured (step S410).

A method for manufacturing one of the plurality of sub-probe units 30 will be explained briefly. The plurality of probe tips 31 inserted into the through holes 33a formed at the probe substrate 33.

To be more specific, if the plurality of probe tips are aligned with each other and coupled to the probe substrate 33, the plurality of probe tips 31 can be fixed by the probe substrate 33 so as not to be misaligned.

When the plurality of probe tips 31 are coupled to the probe substrate 33 as described above, a single sub-probe unit 30 is manufactured. A plurality of sub-probe units 30 are prepared so as to be coupled to the plurality of grooves 21 of the block plate 20.

After the plurality of sub-probe units 30 are manufactured and prepared, the interposer/space transformer unit 100 is manufactured and prepared (step S415). The method for manufacturing the interposer/space transformer unit 100 has been explained above, and, thus, redundant explanations thereof will be omitted.

After the interposer/space transformer unit 100 is manufactured and prepared, the block pate 20 having the plurality of grooves 21 is manufactured and prepared. The block plate 20 can be manufactured by performing a photolithography process and an etching process to a silicon substrate.

After the block plate 20 is completely manufactured, the interposer/space transformer unit 100 to be mounted on the grooves 21 of the block plate 20 is connected to the sub-probe unit 30 (step S425).

The interposer/space transformer unit 100 is connected to the sub-probe unit 30 by means of a ZIF-type coupling between the micro probe pins 130 inserted into the plurality of slits 111 formed at the body part 110 of the interposer/space transformer unit 100 and the probe tips 31 inserted into the through holes 33a formed at the probe substrate 33 of the sub-probe unit 30.

A ZIF-type coupling relationship between the micro pins 130 of the interposer/space transformer unit 100 and the probe tips 31 of the sub-probe unit 30 will be explained in detail as follows.

One side of the micro pin 130 of the interposer/space transformer unit 100 and the tip portion 31a of the probe tip 31 of the sub-probe unit 30 are cross-inserted into the through hole 33a and the slit 111 formed at the body part 110, respectively.

The one side of the micro pin 130 is formed in a hook shape generating a spring friction force, and the micro pin 130 can be inserted into the through hole 33a of the probe substrate 33 by the spring friction force and can be in contact with the tip portion 31a of the probe tip 31 so as to be electrically connected to each other.

Meanwhile, the one side of the micro pin 130 and the tip portion 31a of the probe tip 31 may be formed in a reverse manner. In this case, the tip portion 31a of the probe tip 31 is formed in a hook shape generating a spring friction force, and the tip portion 31a can be inserted into the slit 111 by the spring friction force and can be in contact with the one side of the micro pin 130 so as to be electrically connected to each other.

After the interposer/space transformer unit 100 is connected to the sub-probe unit 30 as described above, the sub-probe unit 30 connected to the interposer/space transformer unit 100 is mounted on the groove 21 formed at the block plate 20 (step S430).

After the sub-probe unit 30 connected to the interposer/space transformer unit 100 is coupled to the groove 21 formed at the block plate 20, the block plate 20 coupled to the sub-probe unit 30 is coupled to the printed circuit board 10 (step S435) and a probe card is completed.

If a probe card of the present illustrative embodiment is applied, the interposer/space transformer unit 100 can electrically connect the printed circuit board 10 of the probe card to the sub-probe unit 30 and can also as a space transformer that transforms a pitch of pads formed on the printed circuit board 10 to a pitch of the probe tips 31 of the sub-probe unit 30.

Therefore, as shown in the present disclosure, the interposer/space transformer unit 100 can transform a pitch, and, thus, a conventional space transformer separately provided to transform a pitch can be eliminated.

In particular, a space transformer requires high manufacturing costs, resulting in an increase of the total manufacturing costs of a probe card. However, as shown in the present illustrative embodiment, such a space transformer is eliminated and the interposer/space transformer unit 100 acts as a space transformer, and, thus, it is possible to reduce the total manufacturing costs of the probe card and also possible to reduce a manufacturing period of the probe card.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

What is claimed is:

1. A probe card in contact with pads formed on a plurality of semiconductor dies on a wafer to test the semiconductor dies, the probe card comprising:
    a printed circuit board on which a plurality of pads are formed;
    a block plate having a plurality of grooves and attached to the printed circuit board;
    a plurality of sub-probe units equipped with a plurality of probe tips in contact with the pads of the semiconductor dies and detachably coupled to the plurality of grooves; and
    a plurality of interposer/space transformer units interposed between the sub-probe units and the printed circuit board and configured to electrically connect the probe tips to the pads of the printed circuit board and transform a pitch of the pads formed on the printed circuit to a pitch of the plurality of probe tips,
    wherein the interposer/space transformer unit comprises:
    a body part oriented along a Z-axis, said body part having a plurality of slits formed along a Y-axis direction perpendicular to the Z-axis direction, said plurality of slits defining a space transformation path; and
    a plurality of micro pins inserted into the plurality of slits along the Z-axis direction of the interposer/space transformer unit, said micro pins electrically connecting the printed circuit board to the sub-probe units,
    wherein the body part is formed by bonding a first silicon substrate and a second silicon substrate along the Y-axis direction,
    the first silicon substrate includes the plurality of slits formed thereon, and
    a surface of the first silicon substrate on which the plurality of slits are formed is matched with the second silicon substrate,
    wherein a distance between the plurality of slits at the printed circuit board's side is greater than a distance between the plurality of slits at the sub-probe unit's side, and
    wherein the sub-probe unit further includes a probe substrate into which the probe tips are inserted, and the probe substrate has a through hole through which a tip portion of the probe tip is protruded from one side and a connection portion of the probe tip is protruded from the other side, and the sub-probe unit is coupled to the interposer/space transformer unit by means of a ZIF-type coupling between the micro probe pin inserted into the slit and the probe tip inserted into the through hole.

2. The probe card of claim 1, wherein one of the interposer/space transformer units and the sub-probe unit corresponding thereto are detachably coupled to one of the grooves.

3. The probe card of claim 1, wherein the plurality of slits that define a space transformation path are formed in the surface of the first silicon substrate by a photolithography process.

4. The probe card of claim 1, wherein one of the plurality of micro pins comprises:
    a first contact portion in contact with the probe tip;
    a second contact portion in contact with the printed circuit board; and
    a pin body portion provided within the slit along the space transformation path.

5. The probe card of claim 4, wherein the first contact portion and the second contact portion are protruded toward an outside of the body part of the interposer/space transformer unit.

6. The probe card of claim 4, wherein the second contact portion includes a stopper configured to determine a position of the micro pin by preventing the second contact portion from being inserted into the slit.

7. The probe card of claim 5, wherein the second contact portion includes one or more bending portions at its termination end.

8. The probe card of claim 4, wherein the plurality of micro pins are formed of at least one material of copper, a copper alloy, nickel, and a nickel alloy or formed by coating the at least one material with gold.

9. The probe card of claim 1, wherein at least a part of the tip portion of the probe tip and at least a part of the first contact portion of the micro pin are cross-inserted into the slit and the through hole, respectively, to be connected to each other.

10. The probe card of claim 1, wherein one of the tip portion and the first contact portion is formed in a hook shape generating a spring friction force and becomes in contact with the other one to be coupled to each other by the spring friction force.

11. A manufacturing method of a probe card in contact with pads formed on a plurality of semiconductor dies on a wafer to test the semiconductor dies, the manufacturing method comprising:
    a) preparing a printed circuit board;
    b) manufacturing and preparing a plurality of sub-probe units each including a plurality of probe tips in contact with the pads formed on the plurality of semiconductor dies;
    c) manufacturing and preparing an interposer/space transformer unit that electrically connects the printed circuit board to the sub-probe units;
    d) manufacturing and preparing a block plate having a plurality of grooves to which the sub-probe units and the interposer/space transformer unit are detachably coupled;
    e) connecting the interposer/space transformer unit to the sub-probe units;
    f) mounting the sub-probe units connected to the interposer/space transformer unit in the grooves of the block plate; and
    g) coupling the block plate on which the sub-probe units are mounted to the printed circuit board,
    wherein the interposer/space transformer unit has a plurality of slits and a distance between the plurality of slits at the printed circuit board's side is greater than a distance between the plurality of slits at the sub-probe unit's side, and
    wherein the sub-probe unit further includes a probe substrate into which the probe tips are inserted, and the probe substrate has a through hole through which a tip portion of the probe tip is protruded from one side and a connection portion of the probe tip is protruded from the other side, and the sub-probe unit is coupled to the interposer/space transformer unit by means of a ZIF-type coupling between the micro probe pin inserted into the slit and the probe tip inserted into the through hole.

12. The manufacturing method of claim 11, wherein one of a first contact portion formed at the micro pin and a tip portion of the probe tip is formed in a hook shape generating a spring friction force and becomes in contact with the other one to be coupled to each other by the spring friction force.

* * * * *

UNITED STATES PATENT AND TRADEMARK OFFICE
CERTIFICATE OF CORRECTION

| | | |
|---|---|---|
| PATENT NO. | : 9,671,431 B2 | Page 1 of 1 |
| APPLICATION NO. | : 14/003310 | |
| DATED | : June 6, 2017 | |
| INVENTOR(S) | : Young Geun Park | |

It is certified that error appears in the above-identified patent and that said Letters Patent is hereby corrected as shown below:

In the Specification

Column 3, Line 24, replace "asking" with -- ashing --.

Column 6, Line 56, replace "asking" with -- ashing --.

Column 7, Line 48, insert -- 31 -- after "tips".

Signed and Sealed this
Twenty-fourth Day of October, 2017

Joseph Matal
*Performing the Functions and Duties of the
Under Secretary of Commerce for Intellectual Property and
Director of the United States Patent and Trademark Office*